US009568360B2

(12) United States Patent
Furumiya

(10) Patent No.: US 9,568,360 B2
(45) Date of Patent: Feb. 14, 2017

(54) SILICON PHOTOMULTIPLIER WITH IMPROVED DETECTION ACCURACY

(75) Inventor: Tetsuo Furumiya, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 0 days.

(21) Appl. No.: 14/388,162

(22) PCT Filed: Mar. 29, 2012

(86) PCT No.: PCT/JP2012/002199
§ 371 (c)(1),
(2), (4) Date: Sep. 25, 2014

(87) PCT Pub. No.: WO2013/145011
PCT Pub. Date: Oct. 3, 2013

(65) Prior Publication Data
US 2015/0053847 A1 Feb. 26, 2015

(51) Int. Cl.
G01J 1/42 (2006.01)
G01J 1/44 (2006.01)
(Continued)

(52) U.S. Cl.
CPC .............. *G01J 1/44* (2013.01); *G01J 1/4228* (2013.01); *G01T 1/20* (2013.01); *G01T 1/208* (2013.01);
(Continued)

(58) Field of Classification Search
CPC .... G01J 1/44; G01J 1/4228; G01J 2001/4453; G01J 2001/446; G01J 2001/4466; G01T 1/20; G01T 1/248
See application file for complete search history.

(56) References Cited

U.S. PATENT DOCUMENTS 8,017,900 B2 * 9/2011 Mathewson ............... G01J 1/46
250/214 R
9,040,898 B2 * 5/2015 Henseler ................. G01T 1/248
250/214.1
(Continued)

FOREIGN PATENT DOCUMENTS

DE  10 2010 041 805 A1  3/2012
JP  2010-536186 A  11/2010
WO  2010073136 A2  7/2010

OTHER PUBLICATIONS

Extended European Search Report issued in European Patent Application No. 12872834.2 dated Apr. 17, 2015.
(Continued)

Primary Examiner — Tony Ko
(74) Attorney, Agent, or Firm — McDermott Will & Emery LLP

(57) ABSTRACT

One embodiment of the disclosure includes an A-D conversion circuit connected to a photodiode for providing a silicon photomultiplier that with enhanced detection accuracy and a time resolution. A current generated upon photon detection by the photodiode partially flows into another photodiode adjacent to the photodiode arranged in parallel via a resistor. At this time, the current is charged into a parasitic capacitance adjacent to the photodiode, and thereafter is discharged. However, the discharged current cannot flow toward an output terminal by the A-D conversion circuit, and also cannot switch the A-D conversion circuit. Consequently, the construction of the disclosure can detect light with no influence of the current discharged from the parasitic capacitance. As a result, the disclosure achieves a silicon photomultiplier with high detection accuracy and a satisfactory time resolution.

8 Claims, 9 Drawing Sheets

(51) Int. Cl.
  *H01L 31/02* (2006.01)
  *G01T 1/24* (2006.01)
  *H01L 27/144* (2006.01)
  *G01T 1/20* (2006.01)
  *G01T 1/208* (2006.01)

(52) U.S. Cl.
  CPC .......... *G01T 1/248* (2013.01); *H01L 27/1446* (2013.01); *H01L 31/02019* (2013.01); *G01J 2001/446* (2013.01); *G01J 2001/4413* (2013.01)

(56) References Cited

U.S. PATENT DOCUMENTS

| | | | |
|---|---|---|---|
| 2006/0175529 A1* | 8/2006 | Harmon | B82Y 20/00 250/207 |
| 2006/0202129 A1 | 9/2006 | Niclass et al. | |
| 2011/0108702 A1 | 5/2011 | Jackson et al. | |
| 2011/0147567 A1* | 6/2011 | Grazioso | H01L 27/14609 250/208.1 |
| 2013/0153975 A1 | 6/2013 | Henseler et al. | |
| 2016/0322417 A1* | 11/2016 | Nagano | H01L 27/14663 |

OTHER PUBLICATIONS

Thomas Frach, "Optimization of the digital Silicon Photomultiplier for Cherenkov light detection", Journal of Instrumentation, Institute of Physics Publishing, Bristol, GB, vol. 7, No. 1, Jan. 31, 2012, p. C01112, XP020217167.

Robert G. W. Brown et al., "Characterization of silicon avalanche photodiodes for photon correlation measurements 1: Passive quenching", Applied Optics, vol. 25, No. 22, Nov. 15, 1986, p. 4122, XP055017179.

International Search Report issued in International Application No. PCT/JP2012/002199 mailed May 1, 2012, with English translation.

* cited by examiner

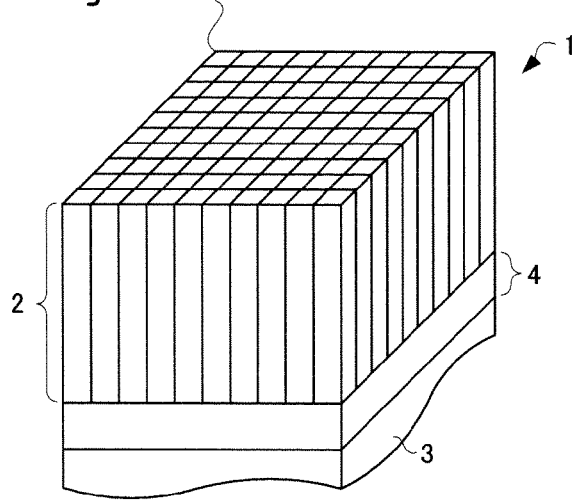

SILICON
PHOTOMULTIPLIER

Prior art

MICROCELL

BIAS VOLTAGE

Prior art

MICROCELL

SILICON PHOTOMULTIPLIER WITH IMPROVED DETECTION ACCURACY

RELATED APPLICATIONS

This application is the U.S. National Phase under 35 U.S.C. §371 of International Application No. PCT/JP2012/002199, filed on Mar. 29, 2012, the disclosure of which is incorporated by reference herein.

TECHNICAL FIELD

The present invention relates to a silicon photomultiplier.

BACKGROUND ART

A silicon photomultiplier (SiPM: Silicon Photomultiplier) is a photoelectric conversion element electrically operatable in the same manner as a photomultiplier tube (PMT) or a micro-channel plate (MCP).

As illustrated in FIG. 16, an SiPM is formed by a two-dimensional assembly of microcells composed of photodiodes (PD).

The microcell is composed of PDs with bias voltage of breakdown voltage or more applied thereto and quenching resistors for recovery of the PDs with Geiger electric discharge phenomenon.

FIG. 17 illustrates a currently-used SiPM. As illustrated in FIG. 17, the PDs with same polarity are arranged in parallel. When light is incident on the SiPM, photons enter into some of the PDs in the macrocell where current is passed in the direction opposite to the polarity. Accordingly, all the current passing through the PDs travels toward an output terminal Iout. The output terminal Iout outputs current with intensity depending on a number of PDs into which the photons enter. See, for example, Japanese Patent Publication (Translation of PCT Application) 2010-536186A.

PATENT LITERATURE

Patent Literature 1
Japanese Patent Publication (Translation of PCT Application) 2010-536186A However, the currently-used apparatus has the following drawback.

Specifically, the currently-used apparatus cannot output data ideally in a large SiPM with many microcells. Such a drawback may arise.

The PDs in each of the microcells contain a certain electric capacitance. That is, each photodiode includes a parasitic capacitance Cp. In other words, as illustrated in FIG. 18, a diode and a capacitor are connected in parallel.

A circuit with such a currently-used construction does not operate ideally. The following describes the reason for this. It is assumed that a photodiode on the left end in FIG. 19 detects photons. At this time, current passes the photodiode. The current occurring at this time corresponds to detection signals. Ideally, the detection signals travel toward the output terminal Iout directly, as illustrated by thick lines in the drawing.

However, this does not happen in actual. That is, the current travels toward the output terminal Iout as well as other photodiodes. Then, the current is partially charged into parasitic capacitances Cp of the other photodiodes. The current is indicated by arrows with dotted lines in FIG. 19.

FIG. 20 illustrates a condition after a long time elapses from a condition of FIG. 19. The current in FIG. 19 charged into each of the parasitic capacitances Cp in the photodiodes is gradually discharged to be outputted to the output terminal Iout. Such current is indicated by arrows with dotted lines in FIG. 20. That is, a low current flows continuously to the output terminal Iout for a long period of time.

FIG. 21 illustrates ideal and actual output from the output terminal Iout. Ideally, when the SiPM detects light, the current outputted from the output terminal Iout rapidly rises and immediately attenuates as illustrated by thick lines in FIG. 21. However, in actual, the influence of the parasitic capacitances Cp causes the current to rise slowly and not to return to its condition prior to incidence of light for a long time as illustrated by dotted lines. With the currently-used construction as noted above, when the SiPM detects light, a waveform becomes slow and signals are continuously outputted for a long period of time. Consequently, the currently-used apparatus has difficulty in accurate determination of a detection time of light by the SiPM.

The present invention has been made regarding the state of the art noted above, and its one object is to provide a SiPM with an enhanced time resolution.

SUMMARY OF INVENTION

Technical Problem

The present invention adopts the following construction for overcoming the above drawback. That is, one embodiment of the present invention discloses a silicon photomultiplier (SiPM) having photodiodes for detecting light being arranged in parallel via resistors. The silicon photomultiplier includes a supply terminal configured to supply a bias voltage to each of the photodiodes, a diode connection resistor connected to each of the photodiodes in series, and a binarization circuit, the binarization circuit each having an input terminal connected to an intermediate node between the photodiode and the diode connection resistor, and an output terminal connected to an output terminal of the silicon photomultiplier via a converting resistor for converting a voltage change into current signals.

Operation and Effect

The embodiment of the present invention includes the binarization circuits connected to the photodiodes. Such a construction causes the voltage change outputted from the photodiodes to be digitized by the binarization circuits for output. The current generated upon detection of photons by a photodiode flows through the resistor connected to an anode to the bias voltage supply terminal and partially flows into the other photodiodes through the resistors each connected thereto in parallel. At this time, the current is charged into the parasitic capacitance adjacent to the photodiode, and after a while, is likely to flow into the output terminal of the silicon photomultiplier. However, the current discharged from the parasitic capacitance cannot flow toward the output terminal by the binarization circuit. Furthermore, the current is a part of current generated upon detection of the photons, and therefore a faint current. Accordingly, the voltage change inputted into the binarization circuit by the current discharged from the parasitic capacitance is not so high that the binarization circuit can be switched. Consequently, the construction of the present invention can detect light with no influence of the current discharged from the parasitic capacitance. As a result, the embodiment of the present invention achieves a silicon photomultiplier with high detection accuracy and a satisfactory time resolution.

Moreover, it is more preferable in the silicon photomultiplier that each of the photodiodes is provided with the diode connection resistor, the binarization circuit, and the converting resistor.

Moreover, it is more preferable in the silicon photomultiplier that auxiliary photodiodes are arranged in parallel to the photodiode with the same polarity in a condition where no resistor is provided on both ends of the photodiode.

Similarly, in the silicon photomultiplier, the auxiliary photodiodes may be arranged in parallel to the photodiode with the same polarity via the resistors.

Operation and Effect

The above is a concrete construction of the present invention. The present invention may adopt various aspects depending on constraint of wiring or application of the silicon photomultiplier.

Operation and Effect

The above is a concrete construction of the present invention. The auxiliary photodiodes are each provided in parallel to the photodiodes with the same polarity in a condition where no resistor is arranged on connection nodes of the binarization circuits. This achieves a silicon photomultiplier having a simple circuit construction.

Moreover, one photodiode includes an anode-side resistor and a cathode-side resistor, the anode-side resistor being connected to a side of the photodiode adjacent to the anode and the cathode-side resistor being connected to a side of the photodiode adjacent to the cathode. The supply terminal includes two supply terminals, one being connected to a diode non-connection node where no photodiode is connected to the anode-side resistor, and the other being connected to a diode non-connection node where no photodiode is connected to the cathode-side resistor. One photodiode includes an anode-side binarization circuit and a cathode-side binarization circuit, the input terminal being connected to the intermediate node between photodiode and the anode-side resistor in the an anode-side binarization circuit, the input terminal being connected to an intermediate node between the photodiode and the cathode-side resistor in the cathode-side binarization circuit. The anode-side binarization circuit is connected to a first output terminal of the silicon photomultiplier via the converting resistor. The cathode-side binarization circuit is connected to a second output terminal of the silicon photomultiplier via the converting resistor. Such is more preferable.

Operation and Effect

The above is a concrete construction of the present invention. As noted above, one photodiode includes two types of binarization circuits, whereby the binarization circuits can be used for different applications individually. For instance, one binarization circuit is used for discrimination of fluorescence intensity, and the other for discrimination of a detection time. This makes a silicon photomultiplier more convenient to use. Alternatively, output from both the binarization circuits is used for differential signals, achieving a silicon photomultiplier with a high noise resistance.

Moreover, it is more preferable that the binarization circuit of the silicon photomultiplier is formed by an inverter circuit.

Operation and Effect

The above is a concrete construction of the present invention. Using the inverter circuit as the binarization circuit achieves a silicon photomultiplier with a high ratio of a light-receiving region and low power consumption.

Moreover, it is more preferable in the silicon photomultiplier that a pulse width adjusting circuit is provided between the binarization circuit and the converting resistor, the pulse width adjusting circuit configured to make a time length of a pulse from the binarization circuit constant and output the pulse.

Operation and Effect

The above is a concrete construction of the present invention. In the above construction, the pulse width from the binarization circuit is not constant. This is because a breakdown voltage of the photodiode depends on temperatures, and the temperatures influence an output current upon photon detection. In addition to this, breakdown voltages of the photodiodes are various, and thus strictly speaking, the output current varies depending on the photodiodes. With the above construction, the pulse width adjusting circuit outputs a pulse with a constant time length from the binarization circuit. This achieves a silicon photomultiplier that allows output of a constant pulse independently of temperatures and variations in breakdown voltage of the photodiodes.

Moreover, it is more preferable that a light detector is provided with the silicon photomultipliers arranged in a two-dimensional matrix.

Moreover, it is more preferable that a radiation detector provided with the silicon photomultipliers includes a scintillator configured to covert radiation into fluorescence, and a light detector with the silicon photomultipliers arranged in a two-dimensional matrix and configured to detect the fluorescence.

Operation and Effect

The above is a concrete configuration of the present invention. The light detector and the radiation detector with the silicon photomultipliers of the present invention has an improved time resolution and is suitable for generating a clear radiation image using precise time information.

Moreover, it is more preferable that each of the silicon photomultipliers includes a plurality of output terminals for distinguishing light incidence position and thus is of a multi-channel type.

Operation and Effect

The above is a concrete construction of the present invention. Accordingly, the embodiment of the present invention is applicable to a multi-channel type silicon photomultiplier.

Advantageous Effects of Invention

The embodiment of the present invention includes the binarization circuit connected to the photodiode. The current generated upon photon detection by the photodiode partially flows into another photodiode adjacent to the photodiode arranged in parallel via the resistor. At this time, the current is charged into the parasitic capacitance adjacent to the photodiode, and thereafter is discharged. However, the discharged current cannot flow toward the output terminal by the binarization circuit, and also cannot switch the binarization circuit. Consequently, the construction of the present invention can detect light with no influence of the current discharged from the parasitic capacitance. As a result, the embodiment of the present invention achieves a silicon photomultiplier with high detection accuracy and a satisfactory time resolution.

BRIEF DESCRIPTION OF DRAWINGS

FIG. 1 is a perspective view of a radiation detector according to one embodiment of the present invention.

FIG. 2 is a plan view of a light detector according to the embodiment of the present invention.

FIG. 3 is a plan view of a silicon photomultiplier according to the embodiment of the present invention.

DESCRIPTION OF EMBODIMENTS

Figure 4:
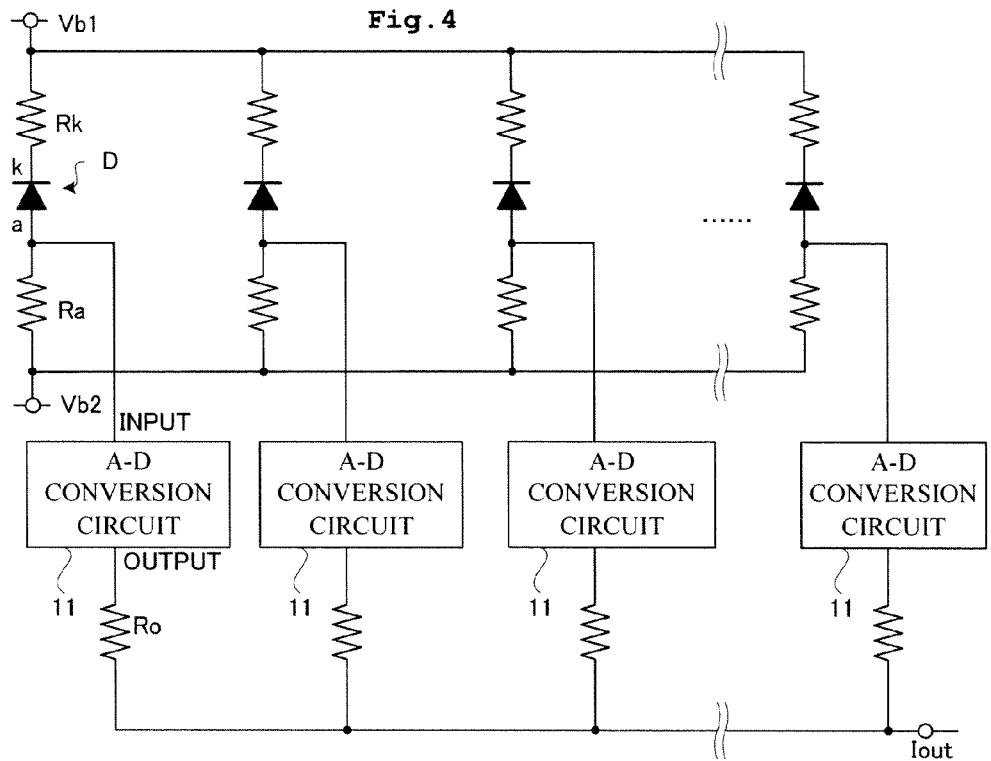
FIG. 4 illustrates an equivalent circuit of the silicon photomultiplier according to the embodiment of the present invention.

The following describes embodiments for carrying out the present invention.

Embodiment 1

<Construction of Radiation Detector>

FIG. 1 illustrates a radiation detector 1 according to the present invention. The radiation detector 1 according to the present invention can detect γ-rays. The radiation detector 1 is installed in a PET (Positron Emission Tomography) apparatus, for example.

The following simply describes the radiation detector 1. As illustrated in FIG. 1, the radiation detector 1 includes a scintillator 2 configured to convert γ-rays into fluorescence, and a light detector 3 configured to detect the fluorescence. Between the scintillator 2 and the light detector 3, a light guide 4 is provided for receiving the fluorescence.

The scintillator 2 has scintillation counter crystals arranged two-dimensionally. The scintillation counter crystal C is composed of Ce-doped $Lu_{2(1-X)}Y_{2X}SiO_5$ (hereinafter, referred to as LYSO). The light detector 3 allows determination of a generating position of fluorescence about which scintillation counter crystal emits fluorescence. In addition, the light detector 3 allows determination of intensity of fluorescence and time when the fluorescence is generated. The radiation detector 1 determines energy of the detected γ-rays from the intensity of fluorescence, thereby allowing output of data on the energy. Here, the scintillator 2 having the configuration of Embodiment 1 is only exemplification of an aspect that may be adopted. Consequently, the configuration of the present invention is not limited to this.

FIG. 2 illustrates the light detector 3. The light detector 3 includes a plurality of silicon photomultipliers 3a arranged in a two-dimensional matrix. For instance, the silicon photomultiplier 3a is a square of 1 mm by 1 mm. When receiving the fluorescence, the silicon photomultiplier 3a allows detection of an incident time and intensity of fluorescence.

FIG. 3 illustrates the silicon photomultiplier 3a. The silicon photomultiplier 3a includes a plurality of photodiodes arranged in a two-dimensional matrix. For instance, the silicon photomultiplier includes photodiodes of 100 by 100 in row and column. When photons constituting the fluorescence are incident on the photodiode, the photodiode outputs a signal that the fluorescence is detected for a certain period of time. In the following description, the photodiode provided in the silicon photomultiplier 3a is simply referred to as a diode D. The diode D corresponds to the photodiode in the present invention.

FIG. 4 illustrates an equivalent circuit of the silicon photomultiplier 3a. The silicon photomultiplier 3a includes a plurality of diodes Ds. Each of the diodes Ds is connected to one another in parallel via an anode-side resistor Ra and a cathode-side resistor to be mentioned later. In other words, the silicon photomultiplier 3a includes modules with the same polarity connected to one another in parallel, each of the modules being formed by three elements Rk, D, Ra connected in series.

Various elements are attached to each of the diodes D. The following describes a condition of connecting one diode D to the elements. One side of the diode D adjacent to a anode a is connected to an anode-side resistor Ra in series, whereas the other end of the diode D adjacent to a cathode k is connected to a cathode-side resistor Rk in series. The cathode k of the diode D is connected to a bias voltage supply terminal Vb1 via the cathode-side resistor Rk. Similarly, the anode a of the diode D is connected to a bias voltage supply terminal Vb2 via the anode-side resistor Ra. That is, the bias voltage supply terminal Vb1 is connected to a diode non-connection node of the cathode-side resistor Rk to which the diode D is not connected. The bias voltage supply terminal Vb2 is connected to a diode non-connection node of the anode-side resistor Ra to which the diode D is not connected. The bias voltage supply terminal Vb1 and the bias voltage supply terminal Vb2 correspond to the supply terminal in the present invention. The anode-side resistor Ra corresponds to the diode connection resistor in the present invention. In addition, the cathode-side resistor Rk corresponds to the diode connection resistor in the present invention.

The voltage applied to the bias voltage supply terminal Vb1 is higher than that to the bias voltage supply terminal Vb2. Consequently, a bias voltage is applied to the diode D in the direction opposite to the polarity of the diode D. Accordingly, no current flows in the diode D. However, since the voltage applied to both ends of the diode D exceeds the breakdown voltage Vbd, the diode D allows passing of the slight current from the bias voltage supply terminal Vb1 to the bias voltage supply terminal Vb2. The voltages applied to the both ends of the diode D is suppressed to be sufficiently lower than the voltage at which the diode D starts damaging.

An intermediate node is provided to an input between the anode a of the diode D and the anode-side resistor Ra. The intermediate node is connected to an input of an analog-to-digital (A-D) conversion circuit 11. The function of the A-D conversion circuit 11 is to be mentioned later. An output of the A-D conversion circuit 11 is connected to the output terminal Iout of the silicon photomultiplier 3a via a converting resistor Ro to be mentioned later. The A-D conversion circuit 11 corresponds to the binarization circuit in the present invention.

As noted above, in each of the diodes D, the three resistors Ra, Rk, Ro and one A-D conversion circuit 11 are connected to form one module, as illustrated in FIG. 4. A plurality of modules with the same polarity is arranged in parallel to form a silicon photomultiplier 3a. The output terminals of the A-D conversion circuits 11 in the silicon photomultiplier 3a are each connected to a common output terminal Iout via the converting resistors Ro. Accordingly, the total outputs of all the A-D conversion circuits 11 in the silicon photomultiplier 3a are outputted from the output terminal Iout. Accurately, the output of the output terminal Iout is conversion of the voltage change in each of the A-D conversion circuits 11 into current.

The following describes the function of the A-D conversion circuit 11. The A-D conversion circuit 11 is a circuit for converting output signals from the diode D as analog data into digital data. Specifically, the A-D conversion circuit 11 is a binarization circuit constituted by an inverter circuit. That is, the A-D conversion circuit 11 shapes the output of the diode in the form of pulses for output.

Figure 5:
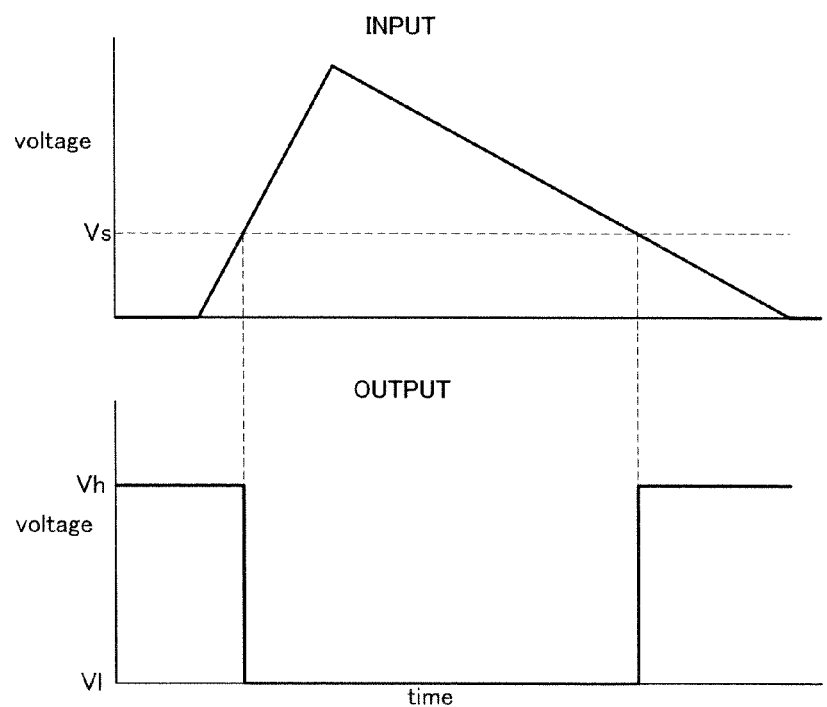
FIG. 5 is a schematic view of an analog-to-digital conversion circuit according to the embodiment of the present invention.

The following describes shaping of the waveform by the A-D conversion circuit 11 in detail. FIG. 5 schematically illustrates the output signals from the diode D on the upper thereof. The output from the diode D is actually a voltage change in a triangle waveform. When receiving such signals, the A-D conversion circuit 11 outputs a waveform voltage change in a well shape, as illustrated on the lower of FIG. 5. Specifically, the A-D conversion circuit 11 has a threshold. The A-D conversion circuit 11 continuously outputs a given voltage Vh until an input voltage increases to exceed the threshold. Then, when the input voltage exceeds the threshold, the A-D conversion circuit 11 starts outputting a voltage Vl. Thereafter, the A-D conversion circuit 11 continuously outputs the voltage Vl until the input voltages decreases to fall below the threshold. Then, when the input voltage falls below the threshold, the A-D conversion circuit 11 again starts outputting the given voltage Vh to maintain this condition until next signals are inputted from the diode D. The threshold set for the A-D conversion circuit 11 is denoted by a numeral Vs on the upper of FIG. 5. The given voltage set for A-D conversion circuit 11 is denoted by a numeral Vh on the lower of FIG. 5.

The following describes the converting resistor Ro. The converting resistor Ro fetches operation of the A-D conversion circuit 11 as signals. The A-D conversion circuit 11 merely changes outputs of the voltage. Accordingly, some current signal is not always outputted from the output. Then, the converting resistor Ro for converting the voltage change into fluctuations of current is connected to the A-D conversion circuit 11. The current passing through the converting resistor Ro changes depending on the output voltage of the A-D conversion circuit 11. Thereafter, the current having passed through the converting resistor Ro is outputted to the output terminal Iout of the silicon photomultiplier 3a. As noted above, the converting resistor Ro converts the voltage change of the output terminal in the A-D conversion circuit 11 into the current signals, and the signals are outputted to the output terminal Iout of the silicon photomultiplier 3a.

<Operation of Silicon Photomultiplier>

The following describes operation of the silicon photomultiplier 3a. When photons are incident on one diode D of the silicon photomultiplier 3a, the diode D generates Geiger electric discharge to flow current from the bias voltage supply terminal Vb1 to the bias voltage supply terminal Vb2. Here, the current is referred to as Vb1-Vb2 current. Then, a voltage of the intermediate node between the anode a of the diode D and the anode-side resistor Ra changes. The Geiger electric discharge by the diode D decreases a voltage applied on both ends of the diode D. This causes the diode D to recover from its Geiger electric discharged state, whereby no Vb1-Vb2 current flows again. Then, a voltage in the anode a of the diode D (i.e., a voltage in the intermediate node) returns to its condition prior to incidence of photons. In this manner, when photons are incident on the diode D, the voltage change in a triangle shape as illustrated on the upper of FIG. 5 occurs in the intermediate node. The triangle voltage change in the intermediate node is subjected to binarization with the A-D conversion circuit 11, and thereafter, is converted into current signals with the converting resistor Ro to flow into the output terminal Iout.

<Advantage of Embodiment 1>

Here, the diode D contains a parasitic capacitance. The parasitic capacitance prevents accurate light detection in the currently-used apparatus. However, in Embodiment 1, light detection is allowable with no influence of the parasitic capacitance. The following describes in detail a relationship between fetching signals and the parasitic capacitance in Embodiment 1.

Figure 6:
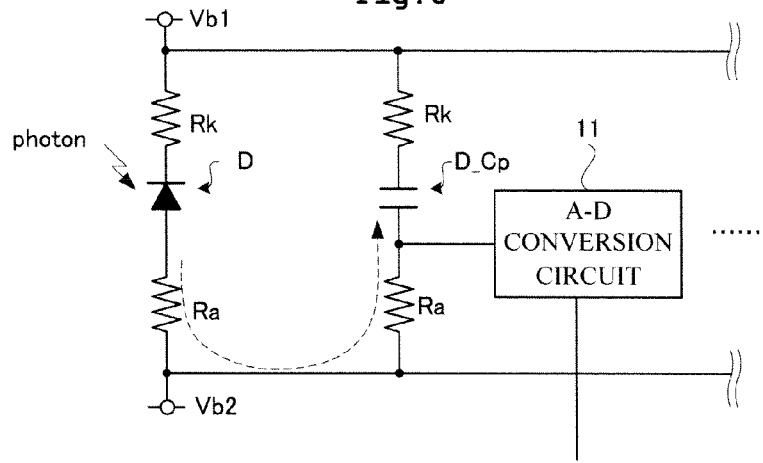
FIGS. 6 to 9 are schematic views each illustrating operation of the silicon photomultiplier.

FIG. 6 illustrates a condition where fluorescence is incident on one diode D. In FIG. 6, a photodiode adjacent to the diode D with incident photons are not illustrated with a symbol of the diode. That is, in FIG. 6, the adjacent diode is illustrated as a capacitor with the parasitic capacitance, and is denoted by a numeral D_cp. Consequently, the capacitor denoted by the numeral D_cp in FIG. 6 means actually a parasitic capacitance of the photodiode.

When photons are incident on the diode D of FIG. 6, Geiger electric discharge is generated to flow the Vb1-Vb2 current. The current is partially routed to the adjacent diode (the element D_cp in FIG. 6) as indicated by dotted lines. The routed current is charged into the parasitic capacitance D_cp and then is discharged gradually. The discharged current is blocked by the A-D conversion circuit 11, and thus cannot flow into the output terminal Iout. Consequently, the feature as in the currently-used apparatus can be avoided that the discharged current from the parasitic capacitance D_cp gradually flows into the output terminal Iout.

Along with the current discharge, the A-D conversion circuit 11 receives the voltage change. If the A-D conversion circuit 11 operates depending on the voltage change, the output terminal Iout outputs signals, indicating light incidence, from a diode with no incident light. However, Embodiment 1 is devised so as not to cause such operation errors of the A-D conversion circuit 11.

Specifically, a switching threshold for the A-D conversion circuit 11 is set sufficiently high to avoid the above operation errors. The current discharged in the parasitic capacitance D_cp is slight, and accordingly the voltage change in the intermediate node is also slight. In Embodiment 1, the threshold for the A-D conversion circuit 11 is higher than a variation in voltage caused by the parasitic capacitance D_cp. Thus, when the A-D conversion circuit 11 receives a slight variation in voltage through discharging the current from the parasitic capacitance D_cp, the variation is less than the threshold and thus is slight for the A-D conversion circuit 11. Consequently, the A-D conversion circuit 11 does not change the outputs of the voltage from the voltage variation. As noted above, the voltage variation due to the parasitic capacitance D_cp cannot cause error operations of the A-D conversion circuit 11.

In Embodiment 1, the current routed to the parasitic capacitance D_cp is suppressed to be less than the currently-used apparatus. This is because the current has to pass via the anode-side resistor Ra to the parasitic capacitance D_cp.

<Another Advantage of Embodiment 1>

The following described another advantage beside the above advantage. A property of the diode D changes under room temperatures. Embodiment 1 achieves detection of fluorescence with no influence of changing the property.

Figure 7:
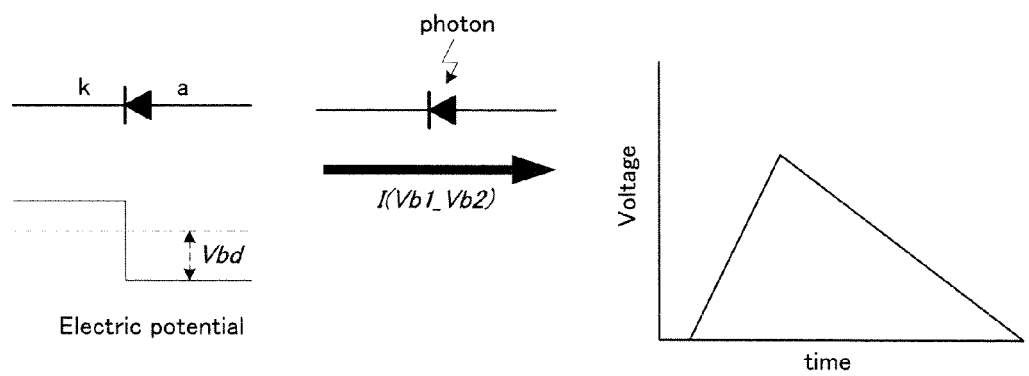
Figure 8:
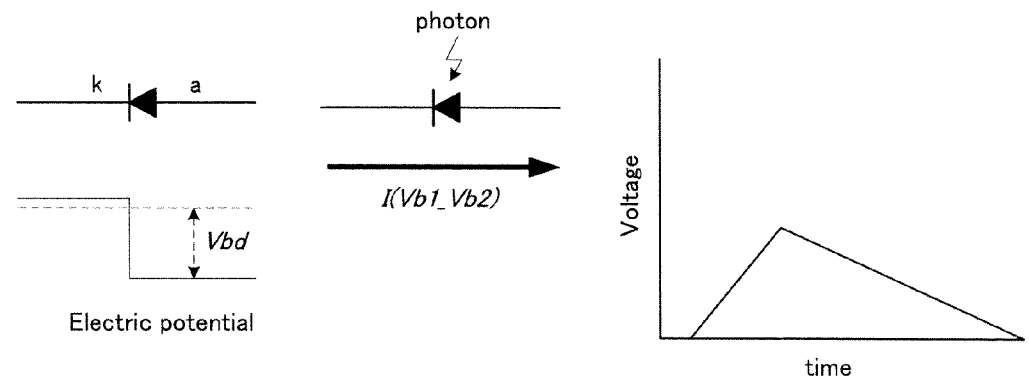

FIG. 7 illustrates operation of the diode D under a low room temperature. FIG. 8 illustrates operation of the diode D under a high room temperature. FIG. 7 illustrates on the left thereof a voltage applied to the diode D as an electric potential. In the drawing, an electric potential indicating a breakdown voltage is denoted by dotted lines. The breakdown voltage is denoted by a numeral Vbd. At this time, the electric potential in the cathode k of the diode D should be higher than that corresponding to the breakdown voltage Vbd. Otherwise, no Geiger electric discharge phenomenon occurs in the diode D, leading to no fluorescence detection. FIG. 7 illustrates in the middle thereof a case where fluorescence (a photon) is incident on the diode D. Specifically, incident fluorescence on the diode D causes Vb1-Vb2 current to flow. In the drawing, the Vb1-Vb2 current is denoted by a numeral I(Vb1_Vb2). FIG. 7 illustrates on the right thereof a voltage change outputted from the diode D under low temperatures. Occurrence of the voltage change has already been described in detail.

FIG. 8 illustrates on the left thereof an electric potential as a voltage applied to the diode D under high temperatures. In the drawing, the electric potential indicating a breakdown voltage Vbd is denoted by dotted lines. Comparison between FIGS. 7 and 8 reveals that the breakdown voltage Vbd increases as the temperature of the diode D increases. Such a variation caused by the temperatures of the breakdown voltage Vbd is one of the properties with the diode D.

Here, the voltage applied to both the ends of the diode D is constant independently of the room temperatures. In other words, as the temperature of the diode D becomes high, a voltage across the diode D approaches the breakdown voltage Vbd. When fluorescence is incident on the diode D under such a condition, the Vb1-Vb2 current becomes lower as illustrated in the middle of FIG. 8. Here, FIG. 8 illustrates on the right thereof a voltage change outputted from the diode D under the high temperatures.

As noted above, the output of the diode D apparently changes depending on a variation in room temperature. The currently-used apparatus requires correction of the variation for eliminating the influence. Specifically, the currently-used apparatus requires for adjusting an amplification factor of the output signals of the silicon photomultiplier 3a or the bias voltage to be applied depending on the room temperatures.

Figure 9:
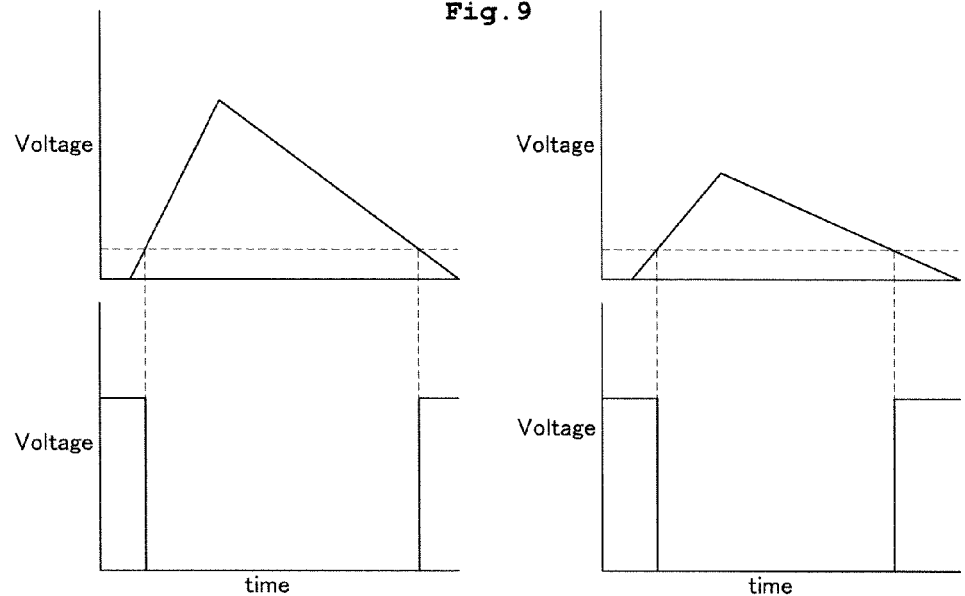

In contrast to this, Embodiment 1 has no need to adjust the amplification factor as above. FIG. 9 illustrates a construction of Embodiment 1. In the drawing, a graph on the upper left thereof illustrates an output of the diode D under a low temperature, whereas a graph on the upper right illustrates an output of the diode D under a high temperature. In the graphs, a voltage change on the upper left of the drawing under the low temperature is converted into one on the lower left thereof by the A-D conversion circuit 11. Similarly, a voltage change on the upper right of the drawing under the high temperature is converted into one on the lower right thereof by the A-D conversion circuit 11. As seen from comparison between the high and low temperature conditions, a variation width of the voltage outputted by switching the A-D conversion circuit 11 is constant independently of the temperatures. Consequently, no variation width of the voltage from the A-D conversion circuit 11 changes depending on the temperatures. Such a construction achieves a silicon photomultiplier 3a that allows output of constant detection signals with no influence of variations in room temperature.

Moreover, the diodes D have various breakdown voltages. Consequently, with the currently-used apparatus, various outputs are generated among the diodes D. This is because the Vb1-Vb2 current is determined from a relationship between the breakdown voltage and the voltage applied to the diode D. In contrast to this, Embodiment 1 includes no variation in output as above. This is because the variation width of the voltage outputted by switching the A-D conversion circuit 11 is constant independently of the breakdown voltage of the diode D. Accordingly, no variation width of the voltage from the A-D conversion circuit 11 changes depending on the breakdown voltage of the diode D. Such a construction achieves a silicon photomultiplier 3a that allows output of constant detection signals with no influence of individual differences of the diodes D.

As noted above, the embodiment of the present invention includes the A-D conversion circuit 11 connected to the diode D. This causes the A-D conversion circuit 11 to digitalize the voltage change from the diode D for output. The current upon detection of photons by the diode D partially flows into a diode D adjacent to and arranged in parallel to the diode D. The partial current is charged into the parasitic capacitance Cp of the adjacent diode D, and after a while, is likely to flow into the output terminal Iout of the silicon photomultiplier 3a. However, the current discharged from the parasitic capacitance Cp cannot flow toward the output terminal Iout by the A-D conversion circuit 11. Furthermore, the current is a part of current generated upon detection of the photons, and therefore a faint current. Accordingly, the voltage change inputted into the A-D conversion circuit 11 by the current discharged from the parasitic capacitance Cp is not so high that the A-D conversion circuit 11 is not switched. Consequently, the construction of the present invention can detect light with no influence of the current discharged from the parasitic capacitance Cp. As a result, the embodiment of the present invention achieves a silicon photomultiplier with high detection accuracy and a satisfactory time resolution.

Moreover, a light detector and a radiation detector provided with the silicon photomultipliers 3a of the present invention enhances signal accuracy and a time resolution, and thus is suitable for generating a clear radiation image.

The present invention is not limited to the above construction, but may be modified as under.

Figure 10:
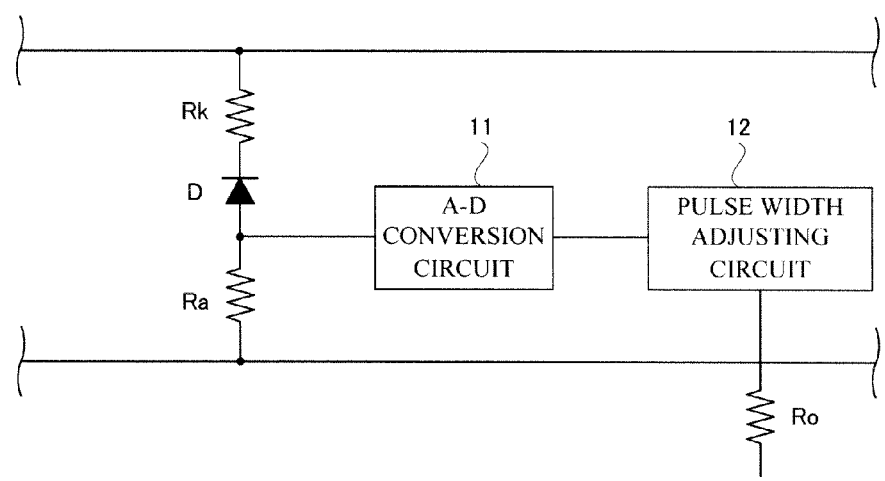
FIG. 10 illustrates an equivalent circuit diagram according to one modification of the present invention.

1. In the above embodiment, the A-D conversion circuit 11 is directly connected to the converting resistor Ro. However, the present invention is not limited to this. Specifically, as illustrated in FIG. 10, the A-D conversion circuit 11 may be connected to the converting resistor Ro via a pulse width adjusting circuit 12. The pulse width adjusting circuit 12 further shapes the output of the diode D already shaped by the A-D conversion circuit 11.

The pulse width adjusting circuit 12 outputs a pulse with a given time width when a time width of the pulse falls between upper and lower limits. Consequently, the pulse width adjusting circuit 12 includes the upper and lower limits, and a set value indicating a time width of a pulse to be outputted. The pulse width adjusting circuit 12 output a time length of the pulse from the A-D conversion circuit 11, and thus is located between the A-D conversion circuit 11 and the converting resistor Ro.

The construction with the pulse width adjusting circuit 12 achieves a silicon photomultiplier 3a that can output signals with high reliability. The following describes an improvement of Embodiment 1. As seen from FIG. 9, a level of the voltage (a variation width of the voltage outputted through switching) from the A-D conversion circuit 11 has no dependence on temperature. On the other hand, a time width of a pulse from the A-D conversion circuit 11 is higher under a high temperature than that under a low temperature. This is because the voltage in the anode a of the diode D under the high temperature exceeds the threshold set by the A-D conversion circuit 11 for a shorter period of time than that under the low temperature.

Figure 11:
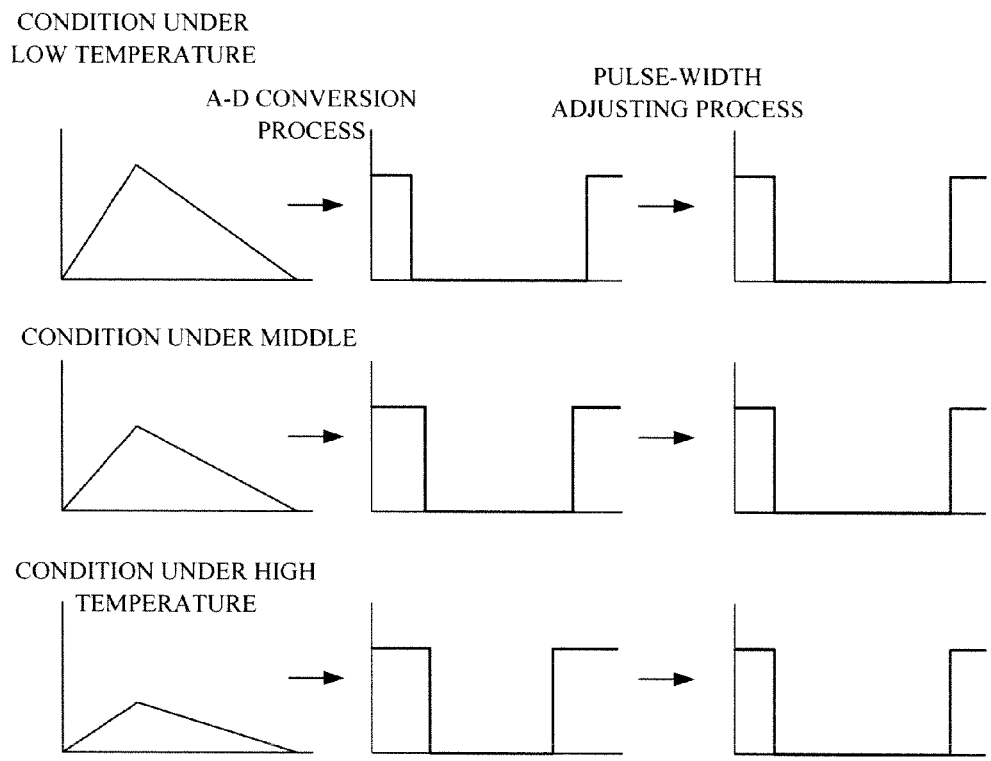
FIG. 11 is a schematic view of the modification of the present invention.

FIG. 11 illustrates how the output of the diode D is shaped in one modification. FIG. 11 illustrates on the left thereof an output of the diode D. As seen from the left of FIG. 11, a voltage change from the diode D becomes smaller as the temperature of the diode D increases. FIG. 11 illustrates in the middle thereof a waveform of the voltage change after A-D converting. This revealed that the waveform of the voltage change is shaped such that the output of the diode D has the pulse with the same magnitude (a magnitude of the voltage change). On the other hand, the time width of the pulse differs depending on the temperatures.

FIG. 11 illustrates on the right thereof a waveform of the voltage change after adjusting the pulse width. As seen from this, the output of the diode D has the same magnitude and the same time width of the pulse in any temperature condition. Such a construction allows each of the diodes D of the silicon photomultipliers 3a to output the same pulse independently of the room temperatures.

With the construction of Embodiment 1, the pulse width from the A-D conversion circuit 11 is not constant. This is because the diode D possesses temperature dependence for an amount of Geiger electric discharge. With the above construction, the pulse width adjusting circuit 12 can output the pulse from the A-D conversion circuit 11 with a constant time length. This achieves silicon photomultiplier 3a that allows output of a constant pulse independently of the temperature of the diode D.

Figure 12:
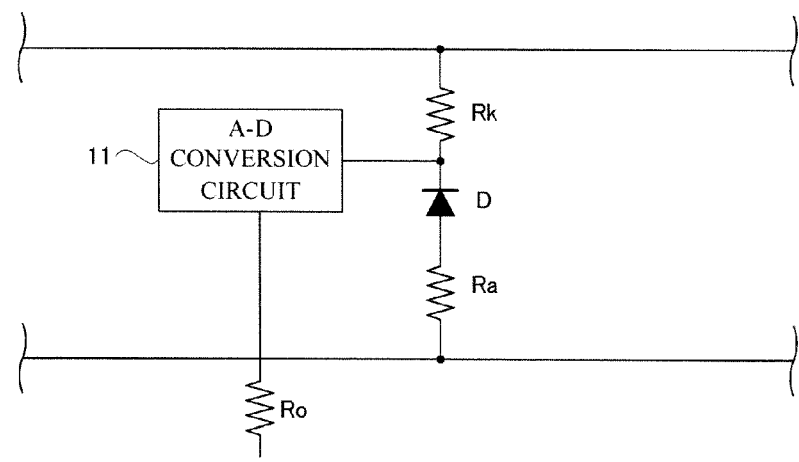
FIGS. 12 to 15 each illustrate the equivalent circuit diagram according to the modification of the present invention.

2. In the above embodiments, the A-D conversion circuit 11 is connected to the intermediate node between the diode D and the anode-side resistor Ra. However, the present invention is not limited to this. Instead of the construction, as illustrated in FIG. 12, the A-D conversion circuit 11 may be connected to the intermediate node between the diode D and the cathode-side resistor Rk. In this case, the anode-side resistor Ra may be omitted.

Figure 13:
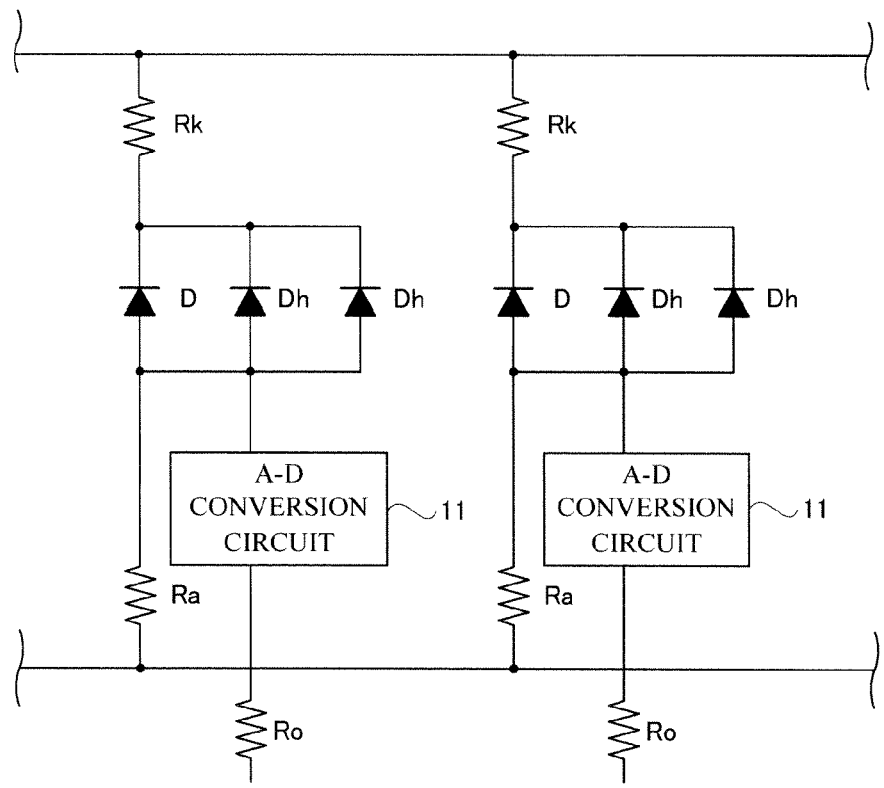

3. With the above embodiments, one diode D includes one anode-side resistor Ra, one cathode-side resistor Rk, one A-D conversion circuit 11, and one converting resistor Ro. However, the present invention is not limited to this. A plurality of diodes D includes one diode D includes one anode-side resistor Ra, one cathode-side resistor Rk, one A-D conversion circuit 11, and one converting resistor Ro. That is, as illustrated in FIG. 13, the diode D with no resistor on both ends thereof and auxiliary diodes Dh are arranged in parallel with the same polarity. Specifically, in the modification, the auxiliary photodiodes (diodes Dh) and the diode D are arranged in parallel with the same polarity under a condition where no resistor is connected to the A-D conversion circuit 11 of the diode D. In other words, in the modification, the auxiliary photodiodes (diodes Dh) and the diode D are arranged in parallel with the same polarity with no resistor connected to the cathode-side resistor Rk of the diode D.

At this time, the diode D and the auxiliary diodes Dh are arranged in parallel directly without the resistor. Accordingly, the input of the A-D conversion circuit 11 is connected to a plurality of diodes. Here, the output from the diodes D and Dh arranged in parallel without the resistor is summed up to transmit it to the A-D conversion circuit 11.

As noted above, each of the diodes D is connected to three resistors Ra, Rk, Ro, a plurality of auxiliary diodes Dh, and one A-D conversion circuit 11 as illustrated in FIG. 13 to form one module. A plurality of modules is connected in parallel to form a silicon photomultiplier 3a. Such a construction simplifies wiring of the light detector. Here, the auxiliary diode Dh corresponds to the auxiliary photodiode in the present invention.

Moreover, in the construction of FIG. 13, a resistor may be located on each side of the auxiliary diodes Dh adjacent to the cathode in series. With such a construction, the auxiliary diodes Dh are arranged in parallel to the photodiode D via the resistor connected to the side of the auxiliary photodiode Dh adjacent to the cathode k. In other words, the auxiliary photodiodes Dh are connected to the diode D and the diode connection resistor with the same polarity under a state where no resistor is connected to the connection node of the A-D conversion circuit 11 to the diode D.

Figure 14:
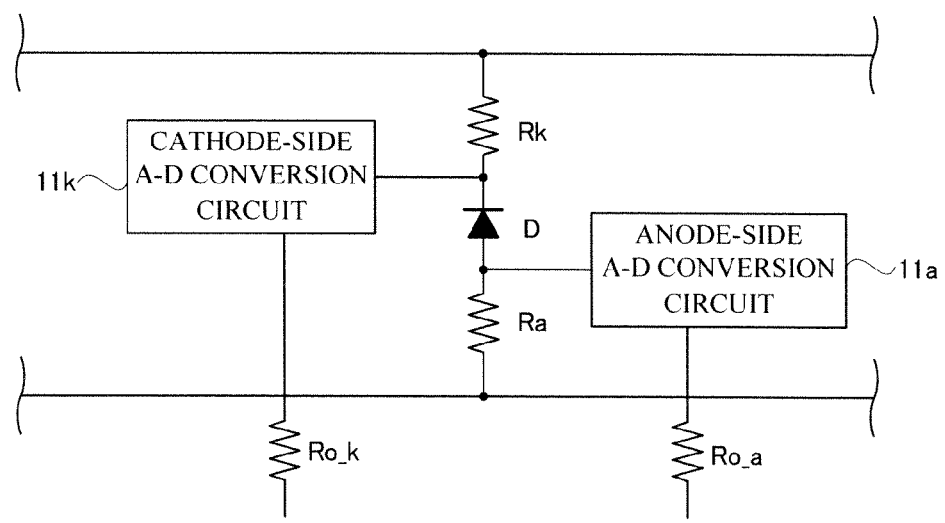

4. Moreover, as illustrated in FIG. 14, the A-D conversion circuits may be provided on both ends of the diode D for carrying out the embodiment of the present invention. With such the construction, an input terminal includes an anode-side A-D conversion circuit 11a connected to the intermediate node between the diode D and the anode-side resistor Ra, and a cathode-side A-D conversion circuit 11k connected to the intermediate node between the diode D and the cathode-side resistor Rk. In the construction, the converting resistor Ro connected to the anode-side A-D conversion circuit 11a is denoted by a numeral Ro_a, and the converting resistor Ro connected to the cathode-side A-D conversion circuit 11k is denoted by a numeral Ro_k. The anode-side A-D conversion circuit 11a corresponds to the anode-side binarization circuit in the present invention. The cathode-side A-D conversion circuit 11k corresponds to the cathode-side binarization circuit in the present invention. That is, the construction of the modification includes a plurality of output terminal Iout_a, and Iout_k connected to outputs of a plurality of converting resistor Ro_a, Ro_k, respectively, connected to the diode D via the A-D conversion circuits.

Figure 15:
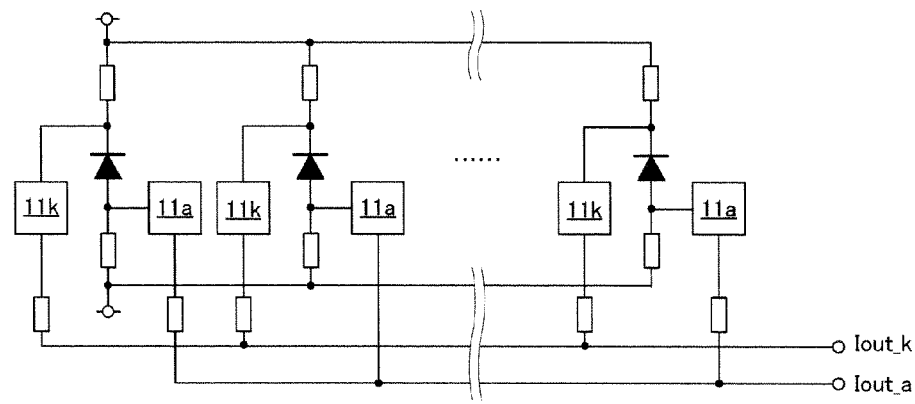
Figure 16:
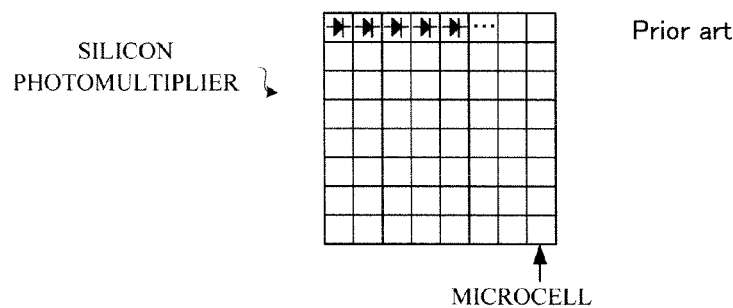
FIG. 16 is a plan view of a currently-used silicon photomultiplier.
Figure 17:
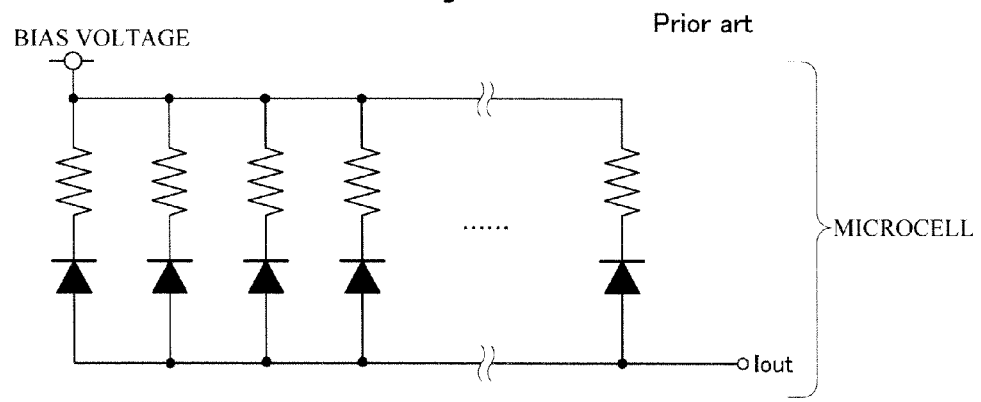
FIG. 17 is an equivalent circuit diagram of the currently-used silicon photomultiplier.
Figure 18:
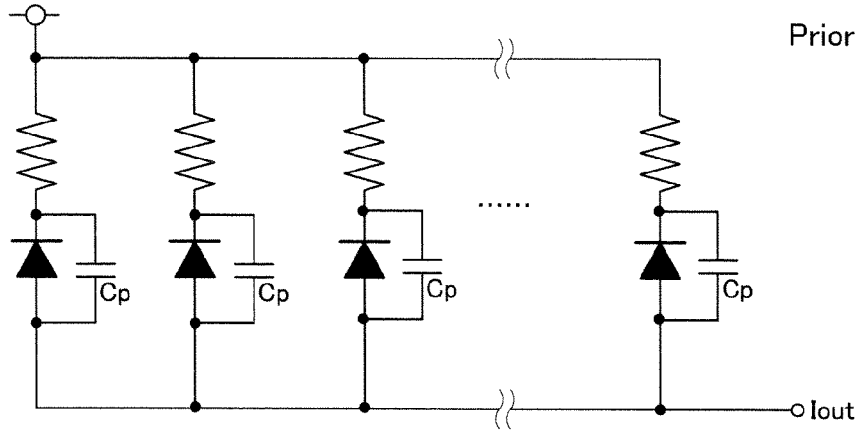
FIGS. 18 to 20 each illustrate an equivalent circuit diagram for describing a problem of the currently-used silicon photomultiplier.
Figure 19:
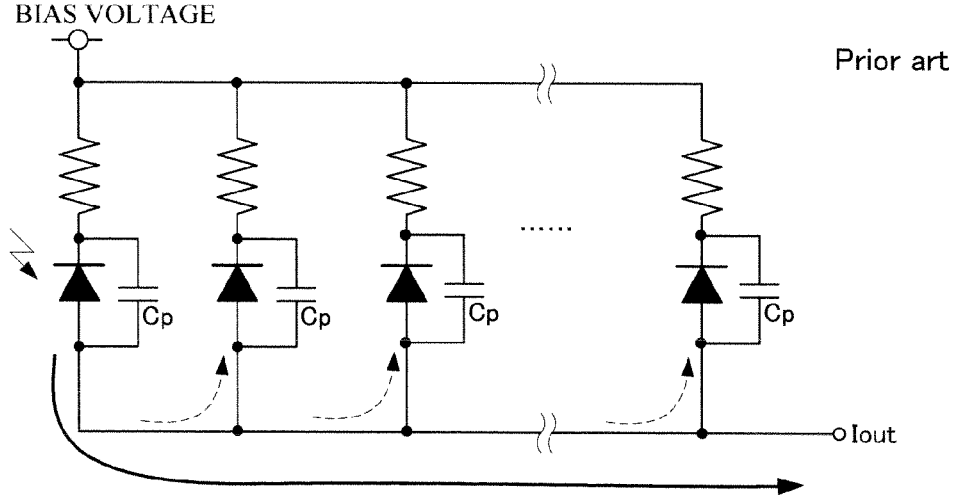
Figure 20:
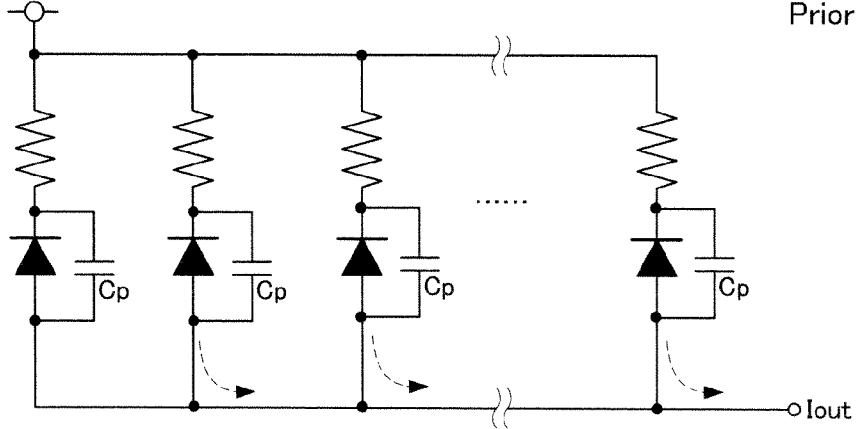
Figure 21:
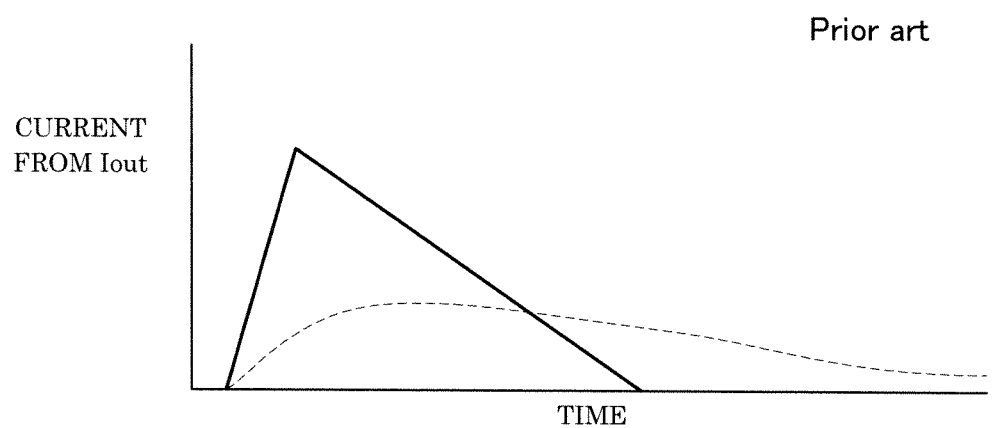
FIG. 21 is a schematic view for describing the problem of the currently-used silicon photomultiplier.

In the modification, the silicon photomultiplier 3a includes two systems of the output terminals. Specifically, as illustrated in FIG. 15, outputs of the anode-side A-D conversion circuits 11a are each connected to a common output terminal Iout_a. Outputs of the cathode-side A-D conversion circuits 11k are each connected to a common output terminal Iout_k. This achieves the silicon photomultiplier 3a that allows more accurate light detection. For instance, the output terminal Iout_a is connected to a circuit for discriminating an intensity of incident light. The output terminal Iout_k is connected to a circuit for discriminating a time of generating the incident light. Such may be adopted. This eliminates noise occurrence caused by interference of the two types of discriminating circuits. Accordingly, enhanced accuracy of the silicon photomultiplier 3a is obtainable. Moreover, the output terminal Iout_k may be adopted instead of the output terminal Iout_a, and the output terminal Iout_a may be adopted instead of the output terminal Iout_k in the above embodiment.

Moreover, the output of the output terminal Iout_k may be used for various types of discrimination, and the output of the output terminal Iout_a may be used for the reference. This achieves a silicon photomultiplier 3a with high reliability. Here in the embodiment, the output of the output terminal Iout_a may be used for various types of discrimination, and the output of the output terminal Iout_k may be used for the reference.

As noted above, one photodiode includes the two types of A-D conversion circuits 11. Accordingly, the A-D conversion circuits 11 may be used for different applications. For instance, one of the A-D conversion circuits 11 may be used for discriminating a fluorescence intensity, and the other is used for discriminating a detection time. This achieves a silicon photomultiplier 3a with enhanced detection accuracy.

5. Moreover, the outputs of the output terminal Iout_k and Iout_a may be used as differential signals. This achieves a silicon photomultiplier 3a with high noise resistance.

6. Moreover, the embodiments may be applied to a multi-channel type silicon photomultiplier. Such a multi-channel type silicon photomultiplier can distinguish an incident position of light. Such a silicon photomultiplier includes not a single output terminal but a plurality of output terminals connected to outputs of the A-D conversion circuit 11 and the converting resistor Ro connected to any photodiodes. For instance, an entire region where a group of diodes D in the silicon photomultiplier are arranged is divided into four regions, and an output terminal is provided independently for the every four regions. Consequently, such a silicon photomultiplier includes four independent circuits for connecting the diodes D in parallel, as illustrated in FIG. 4. As noted above, the four output terminals are provided for distinguishing an incident position of light. Also in this case, the bias voltage supply terminals Vb1, Vb2 may be common among the four circuits.

INDUSTRIAL APPLICABILITY

As noted above, the present invention is suitable for a radiation detector in medical or industrial fields.

REFERENCE SIGN LIST

D diode (photodiode)
Dh auxiliary diode (auxiliary photodiode)
Ra anode-side resistor (diode connection resistor)
Rk cathode-side resistor (diode connection resistor)
Ro converting resistor
Vb1 bias voltage supply terminal (supply terminal)
Vb2 bias voltage supply terminal (supply terminal)
3a silicon photomultiplier
11 A-D conversion circuit (binarization circuit)
11a anode-side A-D conversion circuit (anode-side binarization circuit)
11k cathode-side A-D conversion circuit (cathode-side binarization circuit)
12 pulse width adjusting circuit

The invention claimed is:

1. A silicon photomultiplier with photodiodes for detecting light being arranged in parallel via resistors, the silicon photomultiplier comprising:
a supply terminal configured to supply a bias voltage to each of the photodiodes;
diode connection resistors respectively connected to the photodiodes in series; and
one or more binarization circuits, each binarization circuit having an input terminal connected to a respective intermediate node of intermediate nodes respectively between the photodiodes and the diode connection resistors, wherein
an output terminal of the one, or each of the more than one, binarization circuit is connected to an output terminal of the silicon photomultiplier via a converting resistor for converting a voltage change into current signals.

2. The silicon photomultiplier according to claim 1, wherein
each of the photodiodes is provided with the diode connection resistor, the binarization circuit, and the converting resistor.

3. The silicon photomultiplier according to claim 1, wherein
auxiliary photodiodes are arranged in parallel to the photodiode with the same polarity in a condition where no resistor is provided on both ends of the photodiode.

4. The silicon photomultiplier according to claim 1, wherein
the auxiliary photodiodes are arranged in parallel to the photodiode with the same polarity via the resistors.

5. The silicon photomultiplier according to claim 1, wherein
one photodiode includes an anode-side resistor and a cathode-side resistor, the anode-side resistor being connected to a side of the photodiode adjacent to the anode and the cathode-side resistor being connected to a side of the photodiode adjacent to the cathode,
the supply terminal includes two supply terminals, one being connected to a diode non-connection node where no photodiode is connected to the anode-side resistor and the other being connected to a diode non-connection node where no photodiode is connected to the cathode-side resistor,
one photodiode includes an anode-side binarization circuit and cathode-side binarization circuit,
the input terminal being connected to the intermediate node between photodiode and the cathode-side resistor in the cathode-side binarization circuit,
the input terminal being connected to an intermediate node between the photodiode and the cathode-side resistor in the cathode-side binarization circuit,
the anode-side binarization circuit is connected to a first output terminal of the silicon photomultiplier via the converting resistor, and
the cathode-side binarization circuit is connected to a second output terminal of the silicon photomultiplier via the converting resistor.

6. The silicon photomultiplier according to claim 1, wherein
the binarization circuit of the silicon photomultiplier is formed by an inverter circuit.

7. The silicon photomultiplier according to claim 1, wherein
a pulse width adjusting circuit is provided between the binarization circuit and the converting resistor, the pulse width adjusting circuit configured to make a time length of a pulse from the binarization circuit constant and output the pulse.

8. The silicon photomultiplier according to claim 1, wherein
the silicon photomultiplier includes a plurality of output terminals for distinguishing light incidence position and thus is of a multi-channel type.

* * * * *